United States Patent [19]
Whitehead

[11] Patent Number: 4,980,655
[45] Date of Patent: Dec. 25, 1990

[54] D TYPE FLIP-FLOP OSCILLATOR

[75] Inventor: Joseph L. Whitehead, Decatur, Tex.

[73] Assignee: Reliance Comm/Tec Corporation, Chicago, Ill.

[21] Appl. No.: 517,765

[22] Filed: May 2, 1990

[51] Int. Cl.⁵ .......................... H03B 5/24; H03B 5/36; H03K 3/027
[52] U.S. Cl. ............................... 331/158; 331/108 C; 331/143; 331/DIG. 3
[58] Field of Search ............... 331/108 C, 111, 116 R, 331/116 FE, 143, 158, DIG. 3

[56] References Cited
PUBLICATIONS

Evans, B., "Low Cost Crystal Oscillator For the R6500", *Electronic Engineering*, vol. 50, No. 603, Mar. 1978, p. 17.

*Primary Examiner*—David Mis
*Attorney, Agent, or Firm*—Michael M. Rickin

[57] ABSTRACT

An oscillator for generating a master clock frequency and also dividing that frequency by two. The oscillator uses one flip-flop of a dual D package as the generator for the master clock frequency and the other flip-flop in that package to divide that frequency by two.

6 Claims, 1 Drawing Sheet

4,980,655

D TYPE FLIP-FLOP OSCILLATOR

BACKGROUND OF THE INVENTION

1. Field of The Invention

This invention relates to an oscillator circuit and more particularly, to an oscillator circuit which uses a D type flip-flop.

2. Description of the Prior Art

In telecommunications circuits involving the transmission of signals using digital techniques, it is often necessary to provide a master clock frequency of 1.536 MHz. It is often also necessary in such circuits to provide the frequency of 768 KHz as well as the complement of that frequency as clocking inputs to various counters.

The D type flip-flop is a common choice for dividing the master clock frequency by two to provide the 768 KHz frequency and its complement. D type flip-flops are typically available in an integrated circuit package known as a dual D which includes two such flip-flops. As only one of the flip flops is needed to divide the master clock frequency by two, the other half of the integrated circuit package is not used.

In addition, this usage of the dual D package requires another active device to generate the master clock frequency. It is, however, desirable to fully utilize the dual D package to not only divide the master clock frequency by two and provide the desired complementary outputs, but also to generate that clock frequency. The circuit of the present invention provides that function.

SUMMARY OF THE INVENTION

An oscillator using one of the two D type flip-flops in an integrated circuit package. The one flip-flop has a first voltage amplitude on both of its two output pins when a second voltage amplitude is present simultaneously on both of its control pins.

The oscillator includes means for connecting one of the control pins to a source of the second voltage amplitude. The oscillator further includes an R-C circuit. The R-C circuit has its capacitor connected between the other control pin and the second amplitude voltage source. The resistor of the R C circuit is connected between the other control pin and the one of the two output pins which allows the voltage across the capacitor to follow the voltage on the one output pin. The time constant of the R-C circuit determines the oscillator operating frequency.

DESCRIPTION OF THE PREFERRED EMBODIMENT

Figure 1:
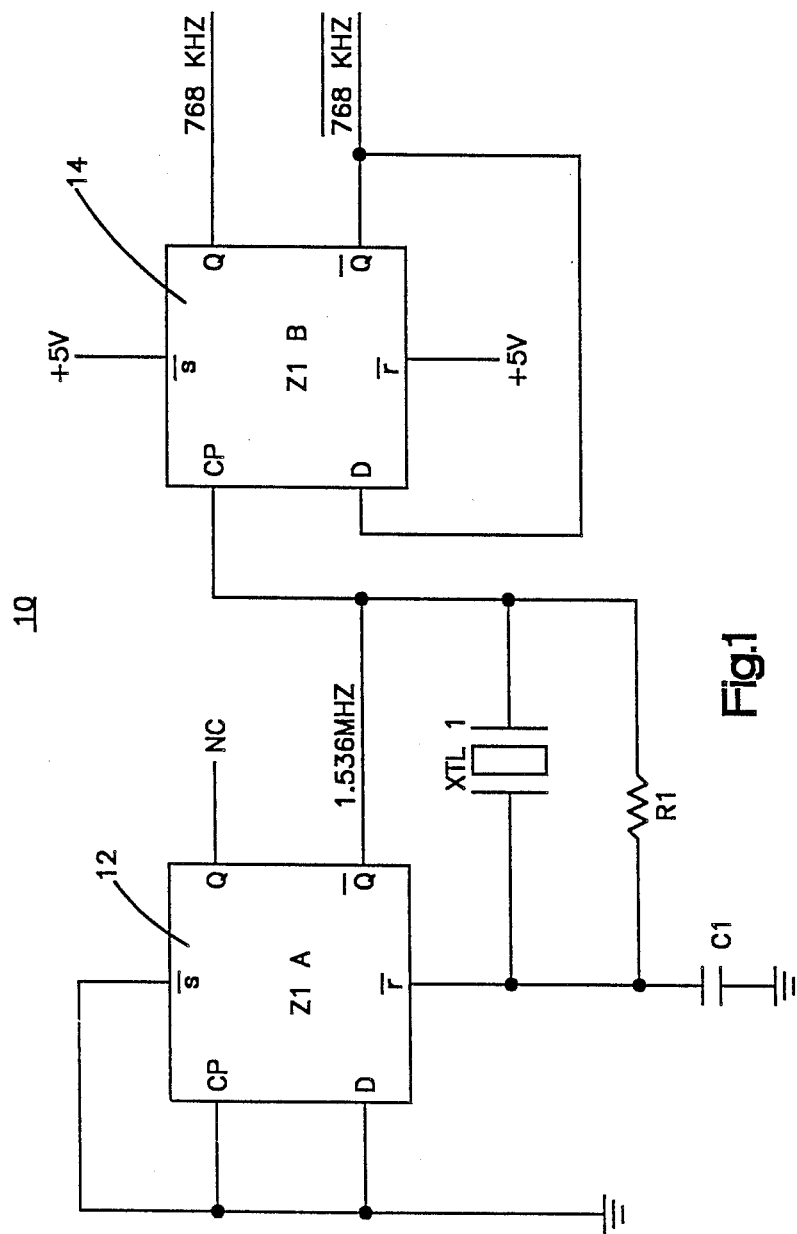
FIG. 1 which is the only drawing FIGURE shows an embodiment for the oscillator circuit of the present invention.

Referring to the only drawing figure, there is shown the circuit 10 of the present invention which provides both the desired master clock frequency of 1.536 MHz and also the complementary outputs having a frequency of 768 KHz. Circuit 10 includes first and second identical D type flip-flops 12 and 14. Both flip-flops have clock pulse (CP) and D input pins. Both flip-flops also have SET and RESET pins which are designated as s NOT and r NOT, respectively. The SET and RESET pins are also known as control pins. Both flip-flops also have Q and Q NOT output pins.

Flip-flop 12 has its CP, D and s NOT pins connected to ground. The r NOT pin is connected to ground through the capacitor C1. The parallel circuit of crystal XTL1 and resistor R1 connects the r NOT pin to the Q NOT output pin. Crystal XTL1 has a resonant frequency of 1.536 MHz. The Q NOT pin is connected to the CP input pin of flip flop 14.

Flip flop 14 has its D input pin connected to its Q NOT output pin. The s NOT and r NOT pins are each connected to +5 volts.

The operation of circuit 10 will now be described. The flip-flops 12 and 14 of the dual D package used in this embodiment will have a HIGH on both output pins when a LOW appears on both the s NOT and r NOT pins, i.e. when both pins are in the active state. This is not a stable operating state for the flip-flop. If both the SET and RESET pins are simultaneously released to the inactive state, i.e. a HIGH simultaneously appears on both the s NOT and r NOT pins, the state of the output pins will be unpredictable.

If, however, only one of the pins is released to the inactive state, the state of the output pins will be determined by the pin which remains in the active state. For example, if both the s NOT and r NOT pins are both initially in the active state and the r NOT or RESET pin is then released to the inactive state, it is the s NOT or SET pin which controls the state of the output pins of the flip-flop. In that case, the Q pin will have a HIGH and the Q NOT pin will have a LOW.

The SET pin of flip flop 12 is always connected to ground. When circuit 10 is initially powered up, the RESET pin of the flip-flop is connected to ground through capacitor C1. Therefore, the Q and Q NOT output pins of the flip-flop are both HIGH. As the Q NOT output pin is HIGH, the capacitor C1 charges towards the HIGH through resistor R1. Thus, the voltage on the RESET pin increases from the LOW towards the HIGH.

As the capacitor C1 charges, the voltage on the flip-flop's RESET pin increases to a level such that it is no longer a valid LOW. At that time, it is then only the SET pin which controls the state of the flip-flop output pins and Q NOT goes LOW. As crystal XTL 1 is connected between the Q NOT and RESET pins, this sudden change in voltage excites the crystal and it oscillates. The resistance of R1 and the capacitance of C1 are selected such that the time constant R1C1 is much longer than the time for one half cycle of the crystal's resonant frequency. Therefore, the crystal dominates the frequency of oscillation. The long time constant ensures that the change in state of the Q NOT output pin occurs on the linear portion of the C1 voltage waveform.

It should be appreciated that if crystal control of the frequency of oscillation is not necessary or desired, then the crystal can be omitted. In that case, the frequency of oscillation would be determined by the R1C1 time constant. Then periodic voltage at the Q NOT output pin would then first change from a HIGH to a LOW as capacitor C1 charged and then from a LOW to a HIGH as the capacitor discharged. The latter change initiates the next cycle of the voltage waveform.

In the embodiment described above for circuit 10, a type 74HC74 dual D package available from National Semiconductor of Santa Clara, Calif. was used.

It is to be understood that the description of the preferred embodiment is intended to be only illustrative, rather than exhaustive, of the present invention. Those of ordinary skill will be able to make certain additions, deletions, and/or modifications to the embodiment of the disclosed subject matter without departing from the spirit of the invention or its scope, as defined by the appended claims.

What is claimed is:

1. An oscillator comprising:
   (a) an integrated circuit package having first and second D type flip-flops, one of said flip-flops having SET and RESET pins, Q and Q NOT output pins and a HIGH on both of said Q and Q NOT pins when said SET and RESET pins are both simultaneously LOW;
   (b) means for connecting said one flip-flop SET pin to ground; and
   (c) an R-C circuit comprising:
      (i) a capacitor connected between said RESET pin and ground; and
      (ii) a resistor connected between said RESET pin and said Q NOT pin, the time constant of said R-C circuit determining the operating frequency of said oscillator.

2. The oscillator of claim 1 further comprising a crystal having a resonant frequency connected in parallel with said R-C circuit and beginning to oscillate when said capacitor initially charges from ground level to a voltage sufficient to allow said LOW at said SET pin to change said Q NOT output pin from a HIGH to a LOW.

3. The oscillator of claim 2 wherein the time constant of said R-C circuit is much longer than the time for one half cycle of said crystal resonant frequency so that said crystal determines said oscillator operating frequency.

4. The oscillator of claim 3 wherein said crystal resonant frequency is 1.536 MHz.

5. The oscillator of claim 1 wherein said one flip-flop also has CP and D pins and said connecting means also for connecting said CP and D pins to ground.

6. An oscillator comprising:
   (a) an integrated circuit package having first and second D type flip-flops, one of said flip flops having a first voltage amplitude on both of its two output pins when a second voltage amplitude is present simultaneously on both of its control pins;
   (b) means for connecting one of said control pins to a source of said second voltage amplitude; and
   (c) an R-C circuit comprising:
      (i) a capacitor connected between the other of said control pins and said second voltage amplitude source; and
      (ii) a resistor connected between said other control pin and the one of said two output pins which allows the voltage amplitude across said capacitor to change to follow the voltage amplitude on said one output pin, the time constant of said R-C circuit determining the operating frequency of said oscillator.

* * * * *